(12) United States Patent
Kojima et al.

(10) Patent No.: US 11,427,084 B2
(45) Date of Patent: Aug. 30, 2022

(54) VEHICLE

(71) Applicant: Toyota Jidosha Kabushiki Kaisha, Toyota (JP)

(72) Inventors: Koichi Kojima, Toyota (JP); Shingo Yumoto, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 397 days.

(21) Appl. No.: 16/781,108

(22) Filed: Feb. 4, 2020

(65) Prior Publication Data
US 2020/0247242 A1 Aug. 6, 2020

(30) Foreign Application Priority Data
Feb. 6, 2019 (JP) .............................. JP2019-019933

(51) Int. Cl.
| | |
|---|---|
| B60L 3/00 | (2019.01) |
| B60L 50/51 | (2019.01) |
| G01R 31/327 | (2006.01) |
| B60L 53/16 | (2019.01) |
| B60L 53/10 | (2019.01) |
| H02J 7/00 | (2006.01) |
| B60L 53/60 | (2019.01) |
| B60L 53/14 | (2019.01) |

(52) U.S. Cl.
CPC ........... *B60L 3/0046* (2013.01); *B60L 3/0084* (2013.01); *B60L 50/51* (2019.02); *B60L 53/11* (2019.02); *B60L 53/14* (2019.02); *B60L 53/16* (2019.02); *B60L 53/60* (2019.02); *G01R 31/3278* (2013.01); *H02J 7/0029* (2013.01); *H02J 2310/48* (2020.01); *Y02T 10/7072* (2013.01); *Y02T 90/12* (2013.01); *Y02T 90/14* (2013.01)

(58) Field of Classification Search
CPC ..... Y02T 10/7072; Y02T 90/14; Y02T 90/12; B60L 3/0046; B60L 3/00; B60L 3/04; B60L 53/00; B60L 53/16; B60L 53/14; B60L 3/0069; B60L 53/11; G01R 31/3278; H02J 2310/48; H02J 7/0029; H02J 7/0031
See application file for complete search history.

(56) References Cited

U.S. PATENT DOCUMENTS

2016/0272070 A1* 9/2016 Kojima ................. B60L 3/0069
2018/0294660 A1* 10/2018 Byun .................... B60L 3/0046

FOREIGN PATENT DOCUMENTS

| JP | 2013-188068 A | 9/2013 | |
|---|---|---|---|
| JP | 2016-073110 A | 5/2016 | |
| WO | WO-2015162476 A1 * | 10/2015 | .......... B60L 11/1816 |

* cited by examiner

*Primary Examiner* — Ryan Johnson
(74) *Attorney, Agent, or Firm* — Dinsmore & Shohl LLP

(57) ABSTRACT

An ECU of a vehicle performs diagnosis processing for diagnosing whether or not a charge relay has stuck after end of charging of a power storage. When the diagnosis processing has not normally ended, the ECU requests connection again of a connector to a charge port for performing re-diagnosis processing for diagnosing again whether or not the charge relay has stuck. When the connector and the charge port are connected to each other again, the ECU determines whether or not it has received a charging start signal from a DC power feed facility. When the ECU has received the charging start signal, it does not perform re-diagnosis processing.

4 Claims, 10 Drawing Sheets

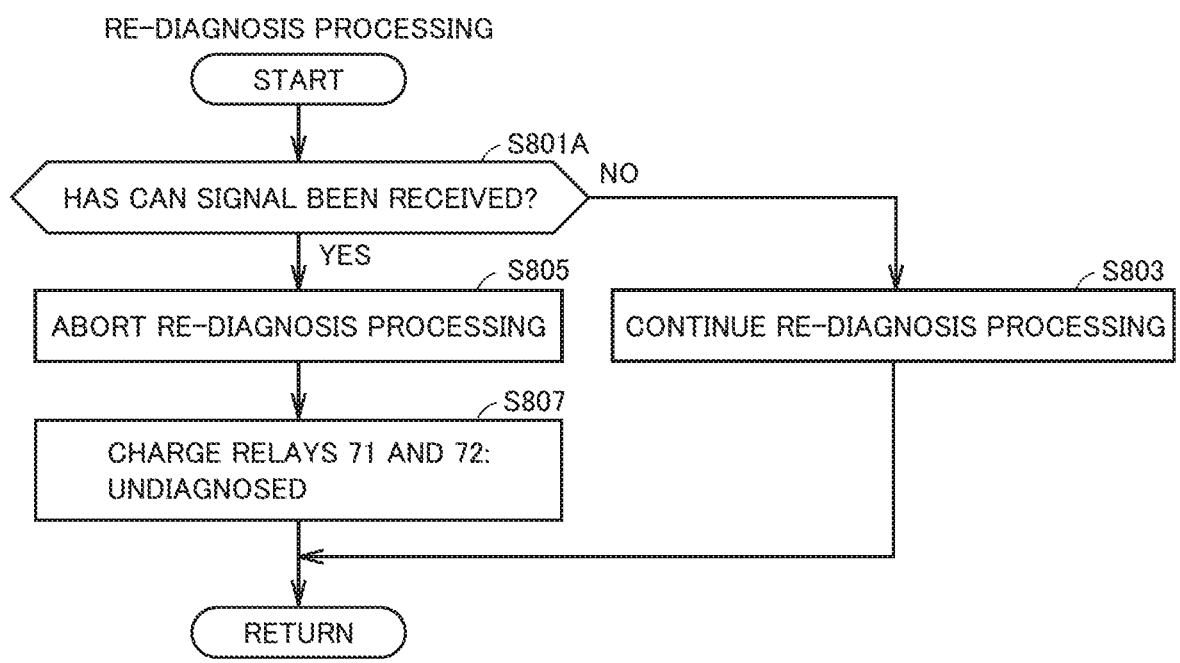

ized by the controller with the connector being connected
VEHICLE

CROSS REFERENCE TO RELATED APPLICATIONS

This nonprovisional application claims priority to Japanese Patent Application No. 2019-019933 filed with the Japan Patent Office on Feb. 6, 2019, the entire contents of which are hereby incorporated by reference.

BACKGROUND

Field

The present disclosure relates to a vehicle in which an incorporated power storage is chargeable by receiving electric power supplied from a power feed facility outside the vehicle.

Description of the Background Art

Japanese Patent Laying-Open No. 2013-188068 discloses a vehicle capable of direct-current (DC) charging in which an incorporated power storage is chargeable by receiving DC power supplied from a power feed facility outside the vehicle. This vehicle includes a charge port for connection of a connector of the power feed facility, a voltage sensor that detects a voltage applied to the charge port, a charge relay (a first charge relay and a second charge relay) electrically connected between the charge port and a power storage, and a controller that diagnoses whether or not the charge relay has stuck. In the vehicle, after end of DC charging, whether or not a charge relay has stuck is diagnosed by the controller with the connector being connected to the charge port. A power feed facility that supplies DC power is also referred to as a "DC power feed facility" below.

Diagnosis as to whether or not a charge relay has stuck includes, for example, processing for diagnosing whether or not both of charge relays have stuck. Specifically, an open command is output to both of the first charge relay and the second charge relay and whether or not sticking has occurred is diagnosed based on whether or not the voltage sensor detects a voltage of the power storage. When the voltage sensor detects the voltage of the power storage, both of the first charge relay and the second charge relay are determined as having stuck in a closed state. When the voltage sensor does not detect the voltage of the power storage, at least one of the first charge relay and the second charge relay is determined as not having stuck in the closed state.

SUMMARY

When diagnosis as to sticking has not normally ended, connection again of the connector to the charge port may be requested of a user and whether or not a charge relay has stuck may be diagnosed again. Processing for diagnosing again whether or not a charge relay has stuck is also referred to as "re-diagnosis processing" below.

Among current DC power feed facilities, there is a DC power feed facility of such specifications that it starts a charge sequence as a connector is connected to a charge port. When the DC power feed facility of such specifications is employed, as the connector is connected to the charge port for re-diagnosis processing, the DC power feed facility may start the charge sequence and apply a voltage to the charge port. Alternatively, after the user connects again the connector to the charge port, the user may inadvertently operate a charging start switch for starting DC charging provided in the power feed facility. As the charging start switch is operated, the DC power feed facility may start the charge sequence and apply a voltage to the charge port.

When re-diagnosis processing is performed while a voltage is being applied by the DC power feed facility to the charge port, a voltage sensor may detect the voltage in spite of the charge relay being normally open in accordance with an open command. Consequently, in spite of the charge relay not having stuck, the charge relay may erroneously be diagnosed as having stuck in a closed state.

The present disclosure was made to solve the problem above, and an object thereof is to suppress erroneous diagnosis of sticking of a charge relay due to application of a voltage by a DC power feed facility to a charge port in re-diagnosis processing for the charge relay.

A vehicle according to the present disclosure includes a power storage chargeable by receiving electric power supplied through a charge cable from a power feed facility outside the vehicle, a charge port to which a connector provided in the charge cable can be connected, a first charge relay electrically connected between a positive electrode of the power storage and the charge port, a second charge relay electrically connected between a negative electrode of the power storage and the charge port, and a controller that performs diagnosis processing for diagnosing whether the first charge relay and/or the second charge relay have/has stuck with the connector and the charge port being connected to each other. The controller performs the diagnosis processing after end of charging of the power storage. When the diagnosis processing has not normally ended, the controller requests connection again of the connector to the charge port for performing re-diagnosis processing for diagnosing again whether or not the first charge relay and/or the second charge relay have/has stuck. When the connector and the charge port are connected to each other again and when the controller receives a start signal indicating start of charging from the power feed facility, the controller does not perform the re-diagnosis processing.

In one embodiment, the diagnosis processing not having normally ended includes determination as the first charge relay and/or the second charge relay having stuck in the diagnosis processing and the diagnosis processing not having been completed.

When the power feed facility is to start a charge sequence, a start signal indicating start of charging is transmitted from the power feed facility to the vehicle. When the start signal is received from the power feed facility, a voltage may be applied by the power feed facility to the charge port. According to the configuration, when the start signal is received from the power feed facility with the connector and the charge port being connected to each other again, re-diagnosis processing is not performed. By not performing re-diagnosis processing under such a condition that a voltage may unintentionally be applied by the power feed facility to the charge port, erroneous diagnosis in re-diagnosis processing that the charge relay has stuck can be suppressed.

In one embodiment, when the connector and the charge port are connected again to each other and when the controller has not received the start signal from the power feed facility, the controller performs the re-diagnosis processing.

When the start signal has not been received from the power feed facility, it can be estimated that the power feed facility will not start the charge sequence. It can be estimated that the condition is not such that a voltage may unintentionally be applied by the power feed facility to the charge port and no voltage will be applied by the power feed facility to the charge port. In this case, whether or not a charge relay has stuck can appropriately be diagnosed by performing re-diagnosis processing.

In one embodiment, when the controller receives the start signal from the power feed facility while it is performing the re-diagnosis processing, the controller aborts the re-diagnosis processing.

For example, it is assumed that a start signal is transmitted from the power feed facility to the vehicle by an inadvertent operation by a user of a charging start switch provided in the power feed facility while re-diagnosis processing is being performed. When re-diagnosis processing is continued in such a case, a voltage may be applied by the power feed facility to the charge port, and due to such application of the voltage, in spite of the charge relay not having stuck, erroneous diagnosis that the charge relay has stuck in a closed state may be made. By aborting re-diagnosis processing when a start signal is received from the power feed facility while the re-diagnosis processing is being performed, erroneous diagnosis in the re-diagnosis processing that the charge relay has stuck can be suppressed.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 10 is a flowchart for illustrating a procedure in processing for monitoring for reception of a CAN signal.

DETAILED DESCRIPTION

Figure 1:
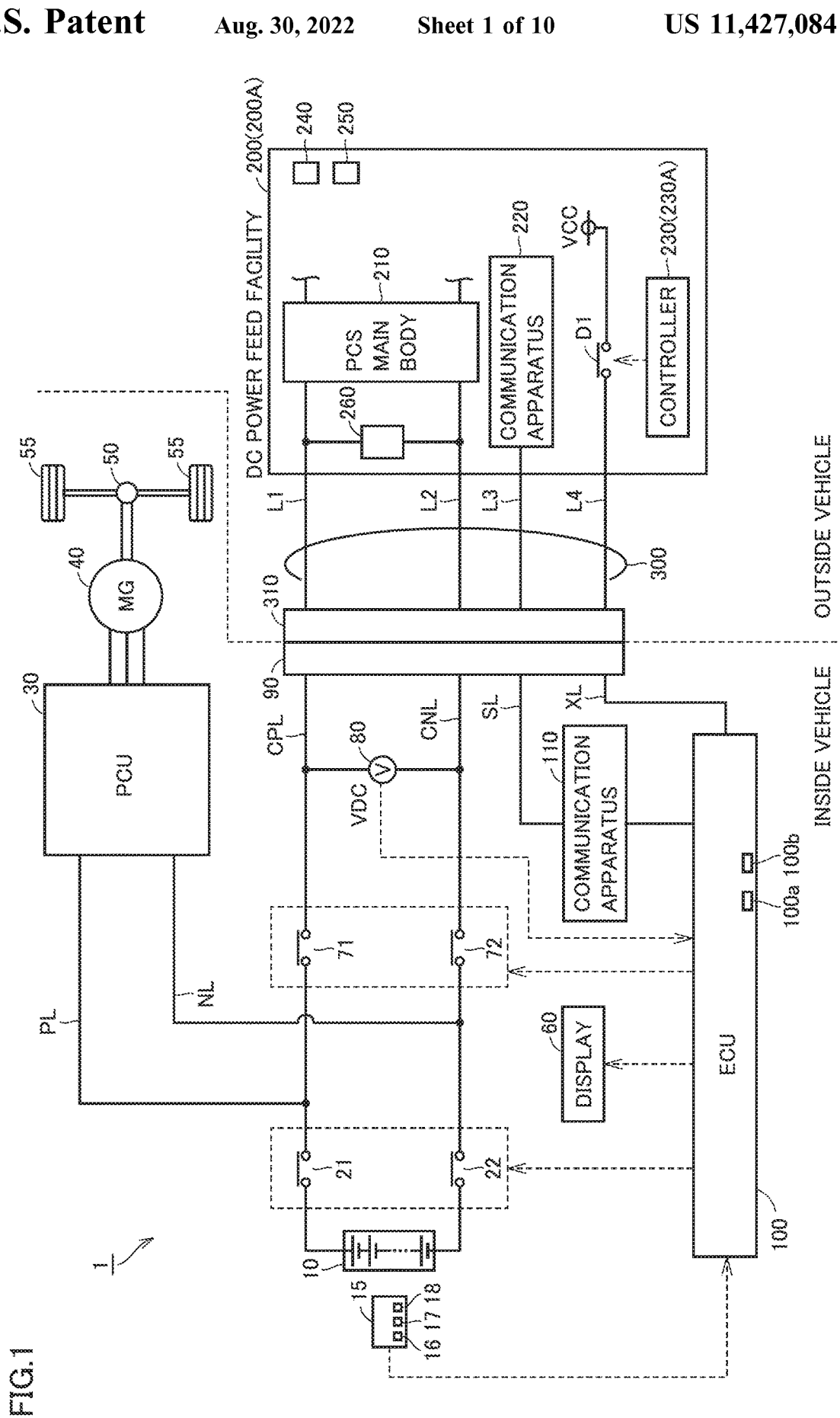
FIG. 1 is a block diagram showing an exemplary configuration of a vehicle according to a first embodiment.

An embodiment of the present disclosure will be described below in detail with reference to the drawings. The same or corresponding elements in the drawings have the same reference characters allotted and description thereof will not be repeated.

<Overall Configuration>

FIG. 1 is a block diagram showing an exemplary configuration of a vehicle 1 according to the present embodiment. Though an example in which vehicle 1 according to the present embodiment is an electric vehicle is described, vehicle 1 may be capable of DC charging in which an incorporated power storage is charged by receiving DC power supplied from a DC power feed facility 200, and it is not limited to an electric vehicle. For example, vehicle 1 may be a plug-in hybrid vehicle or a fuel cell vehicle.

Referring to FIG. 1, vehicle 1 includes a power storage 10, a monitoring unit 15, system main relays (which are each also referred to as an "SMR" below) 21 and 22, a power control unit (which is also referred to as a "PCU" below) 30, a motor generator (which is also referred to as an "MG" below) 40, a power transmission gear 50, a drive wheel 55, a display 60, and an electronic control unit (ECU) 100. Vehicle 1 includes charge relays 71 and 72, a voltage sensor 80, a charge port 90, and a communication apparatus 110.

Power storage 10 is incorporated in vehicle 1 as a driving power supply (that is, a motive power source) of vehicle 1. Power storage 10 includes a plurality of stacked batteries. Examples of the battery include secondary batteries such as a nickel metal hydride battery and a lithium ion battery. The battery may be a battery containing a liquid electrolyte between a positive electrode and a negative electrode or a battery containing a solid electrolyte (an all-solid-state battery). Power storage 10 may be a rechargeable DC power supply and a large-capacity capacitor can also be adopted.

Monitoring unit 15 monitors a state of power storage 10. Specifically, monitoring unit 15 includes a voltage sensor 16, a current sensor 17, and a temperature sensor 18. Voltage sensor 16 detects a voltage of power storage 10. Current sensor 17 detects a current input to and output from power storage 10. Temperature sensor 18 detects a temperature of power storage 10. Each sensor outputs a result of detection thereby to ECU 100.

SMRs 21 and 22 are electrically connected between power storage 10 and power lines PL and NL. Specifically, SMR 21 has one end electrically connected to a positive electrode terminal of power storage 10 and has the other end electrically connected to power line PL. SMR 22 has one end electrically connected to a negative electrode terminal of power storage 10 and has the other end electrically connected to power line NL. Open/closed states of SMRs 21 and 22 are controlled by a control signal from ECU 100.

PCU 30 is a collective denotation of a power conversion device for driving MG 40 by receiving electric power from power storage 10. PCU 30 is electrically connected to power lines PL and NL and controlled by ECU 100. PCU 30 includes, for example, an inverter that drives MG 40 or a converter that boosts electric power output from power storage 10 and supplies boosted electric power to the inverter.

MG 40 is an alternating-current (AC) rotating electric machine and it is, for example, a permanent magnet synchronous motor including a rotor having a permanent magnet embedded. The rotor of MG 40 is mechanically connected to drive wheel 55 with power transmission gear 50 being interposed. MG 40 generates kinetic energy for running vehicle 1 by receiving AC power from PCU 30. Kinetic energy generated by MG 40 is transmitted to power transmission gear 50. When vehicle 1 is decelerated or stopped, MG 40 converts kinetic energy of vehicle 1 into electric energy. AC power generated by MG 40 is converted to DC power by PCU 30 and DC power is supplied to power storage 10. Regenerated power can thus be stored in power storage 10. MG 40 thus generates driving force or braking force of vehicle 1, with supply and reception of electric power to and from power storage 10 (that is, charging and discharging of power storage 10).

When vehicle 1 is a plug-in hybrid vehicle further including an engine (not shown) as a motive power source, engine output in addition to output from MG 40 can be used as driving force for running. Alternatively, a motor generator (not shown) that generates electric power by using engine output can also further be incorporated to generate charging power for power storage 10 with engine output.

Display 60 shows prescribed information to a user of vehicle 1 in accordance with a control command from ECU 100. Display 60 may be a multi-information display provided on an instrument panel of vehicle 1 or a display screen of a navigator, or may be provided separately from them.

Charge relays 71 and 72 are electrically connected between power lines PL and NL and charge port 90. Specifically, charge relay 71 has one end electrically connected to power line PL and the other end electrically connected to charge port 90 with a power line CPL being interposed. Charge relay 72 has one end electrically connected to power line NL and the other end electrically connected to charge port 90 with a power line CNL being interposed. Open/closed states of charge relays 71 and 72 are controlled by a control signal from ECU 100.

Charge port 90 is configured such that a connector 310 provided at a tip end of a charge cable 300 of DC power feed facility 200 can be connected thereto. Charge cable 300 includes power lines L1 and L2, a communication signal line L3, and a charging start and stop signal line L4. When connector 310 is connected to charge port 90, power lines L1 and L2, communication signal line L3, and charging start and stop signal line L4 of DC power feed facility 200 are connected to power lines CPL and CNL, a communication signal line SL, and a charging start and stop signal line XL of vehicle 1, respectively.

Voltage sensor 80 detects a potential difference between power lines CPL and CNL. Voltage sensor 80 detects a voltage applied to charge port 90. Voltage sensor 80 outputs a result of detection to ECU 100.

Communication apparatus 110 can communicate with DC power feed facility 200 through communication signal line SL. Communication between vehicle 1 and DC power feed facility 200 is in conformity, for example, with a controller area network (CAN) communication protocol. Communication in conformity with the CAN communication protocol is also referred to as "CAN communication" below. Communication between vehicle 1 and DC power feed facility 200 is not limited to CAN communication and may be power line communication (PLC) or wireless communication.

ECU 100 includes a central processing unit (CPU) 100a, a memory 100b, and an input and output buffer (not shown), receives input of signals from various sensors or outputs a control signal to each device, and controls each device. Control is not limited to processing by software and control based on construction of dedicated hardware (electronic circuits) and processing thereby are also applicable.

ECU 100 can calculate a state of charge (SOC) of power storage 10. Various known approaches by using a voltage of power storage 10 detected by monitoring unit 15 and a current input to and output from power storage 10 can be adopted as a method of calculating an SOC of power storage 10.

ECU 100 outputs a calculated SOC of power storage 10 or a voltage of power storage 10 to DC power feed facility 200 through communication apparatus 110. ECU 100 transmits various commands such as an output command requesting DC power feed facility 200 to output electric power, a stop command requesting the DC power feed facility to stop output of electric power, and a charging current command value through communication apparatus 110.

ECU 100 controls open/closed states of SMRs 21 and 22. ECU 100 controls open/closed states of charge relays 71 and 72.

DC power feed facility 200 includes a power conditioning system (PCS) main body 210, a communication apparatus 220, a controller 230, a charging start switch 240, a charging stop switch 250, a leakage detector 260, and a relay D1.

PCS main body 210 converts AC power supplied by a commercial AC power supply (not shown) during charging into DC power.

Communication apparatus 220 can establish CAN communication with communication apparatus 110 of vehicle 1 through communication signal line L3.

Leakage detector 260 is provided on a path for supplying electric power to vehicle 1 and detects whether or not leakage has occurred in the supply path. Specifically, leakage detector 260 detects an equilibrium state of currents that flow in directions opposite to each other through power lines L1 and L2 defining the supply path and detects occurrence of leakage when the equilibrium state is lost. Leakage detector 260 outputs a result of detection to controller 230.

Relay D1 is electrically connected between an output terminal of a power supply VCC and charging start and stop signal line L4. Power supply VCC is a power supply for supplying driving electric power to each component of communication apparatus 220 and controller 230. Power supply VCC is generated, for example, by a power supply circuit (not shown) that has received DC power output from PCS main body 210. Relay D1 connects/disconnects a path between the output terminal of power supply VCC and charging start and stop signal line L4 in accordance with a control signal from controller 230.

Charging start switch 240 is a switch for starting DC charging. Charging start switch 240 is operated by a user when DC charging is to be started. As charging start switch 240 is operated, DC power feed facility 200 starts the charge sequence.

Charging stop switch 250 is a switch for stopping DC charging. Charging stop switch 250 is operated, for example, by a user during DC charging. As charging stop switch 250 is operated, DC power feed facility 200 stops DC charging.

Controller 230 controls relay D1 and PCS main body 210 based on information received from communication apparatus 220 and an operation of charging start switch 240 and charging stop switch 250.

<DC Charging>

Figure 2:
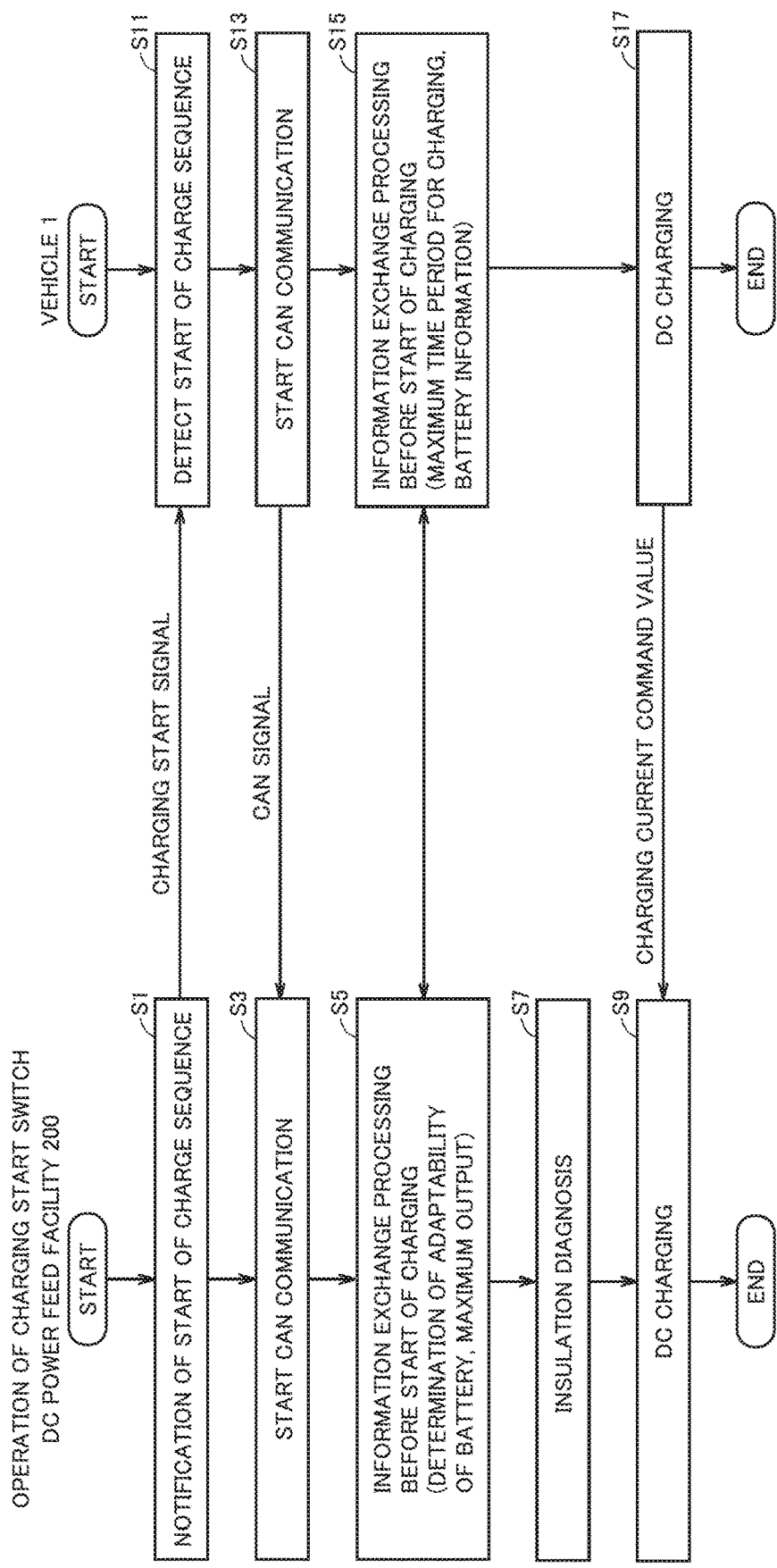
FIG. 2 is a flowchart showing a procedure in processing for starting DC charging performed by a controller of a DC power feed facility and an ECU of the vehicle.

FIG. 2 is a flowchart showing a procedure in processing for starting DC charging performed by controller 230 of DC power feed facility 200 and ECU 100 of vehicle 1. This flowchart is started by an operation of charging start switch 240 of DC power feed facility 200. Though an example in which each step (the step being abbreviated as "S" below) in the flowcharts shown in FIG. 2 and FIG. 8 which will be described later is performed by software processing by controller 230 and ECU 100 is described, the step may be performed partially or entirely by hardware (electrical circuits) fabricated in controller 230 and ECU 100.

As the user operates charging start switch 240 of DC power feed facility 200, DC power feed facility 200 starts the charge sequence.

As the charge sequence is started, controller 230 of DC power feed facility 200 transmits a "charging start signal" indicating start of DC charging to vehicle 1 (S1). Specifically, controller 230 of DC power feed facility 200 has relay D1 closed in response to an operation of charging start switch 240. As relay D1 is closed, the output terminal of power supply VCC and charging start and stop signal line IA are connected to each other and a voltage of power supply VCC is supplied to charging start and stop signal line L4. Then, the voltage of power supply VCC is supplied also to charging start and stop signal line XL on a side of vehicle 1. ECU 100 of vehicle 1 detects reception of the charging start signal from DC power feed facility 200 based on supply of the voltage of power supply VCC to charging start and stop signal line XL. As ECU 100 of vehicle 1 receives the charging start signal, it recognizes that DC power feed facility 200 has started the charge sequence (S11).

In succession, in steps S3 and S13, CAN communication is started between DC power feed facility 200 and vehicle 1. Specifically, data for starting CAN communication is stored in a frame in a prescribed format and the frame (which is also referred to as a "CAN signal" below) is transmitted from vehicle 1 to DC power feed facility 200 (S13). CAN communication is thus started between DC power feed facility 200 and vehicle 1.

Then, processing for exchanging information before start of DC charging is performed between vehicle 1 and DC power feed facility 200. Specifically, ECU 100 transmits battery information such as a maximum voltage of power storage 10 and/or a capacity of power storage 10 and/or information on a time period for charging, to DC power feed facility 200 through CAN communication (S15). Upon receiving such information, controller 230 of DC power feed facility 200 compares, for example, received battery information with specifications of the DC power feed facility, and after it confirms that power storage 10 of vehicle 1 is chargeable (after it determines adaptability), it transmits a maximum output voltage or a maximum output current of DC power feed facility 200 to vehicle 1 through CAN communication (S5).

After the information exchange processing, controller 230 of DC power feed facility 200 carries out insulation diagnosis for diagnosing whether or not an abnormal condition such as short-circuiting or ground fault has occurred in a power supply path of the DC power feed facility (S7). In insulation diagnosis, controller 230 of DC power feed facility 200 applies, for example, a voltage for insulation diagnosis to power lines L1 and L2 and confirms that leakage detector 260 does not detect leakage.

After prescribed preparation for charging is made in vehicle 1 and DC power feed facility 200, DC charging is started (S9 and S17). During DC charging, ECU 100 of vehicle 1 transmits a charging current command value at a prescribed interval to DC power feed facility 200 through communication apparatus 110. DC power feed facility 200 outputs a current corresponding to the charging current command value received from vehicle 1.

<Diagnosis Processing and Re-Diagnosis Processing>

Charge relays 71 and 72 may stick. When charge relay 71 and/or charge relay 72 stick(s), power storage 10 cannot be charged. In particular, when charge relay 71 and/or charge relay 72 stick(s) in the closed state, a voltage of power storage 10 may be applied to charge port 90 at unintended timing. Therefore, in vehicle 1 according to the present embodiment, as DC charging ends, "diagnosis processing" for diagnosing whether or not charge relay 71 and/or charge relay 72 have/has stuck in the closed state is performed.

End of DC charging refers to a state that a condition for end of DC charging is satisfied. For example, a condition that an SOC of power storage 10 is equal to or higher than a prescribed level, a condition that a prescribed time period has elapsed since start of DC charging, or a condition that charging stop switch 250 has been operated is applicable as the condition for end of DC charging.

Figure 3:
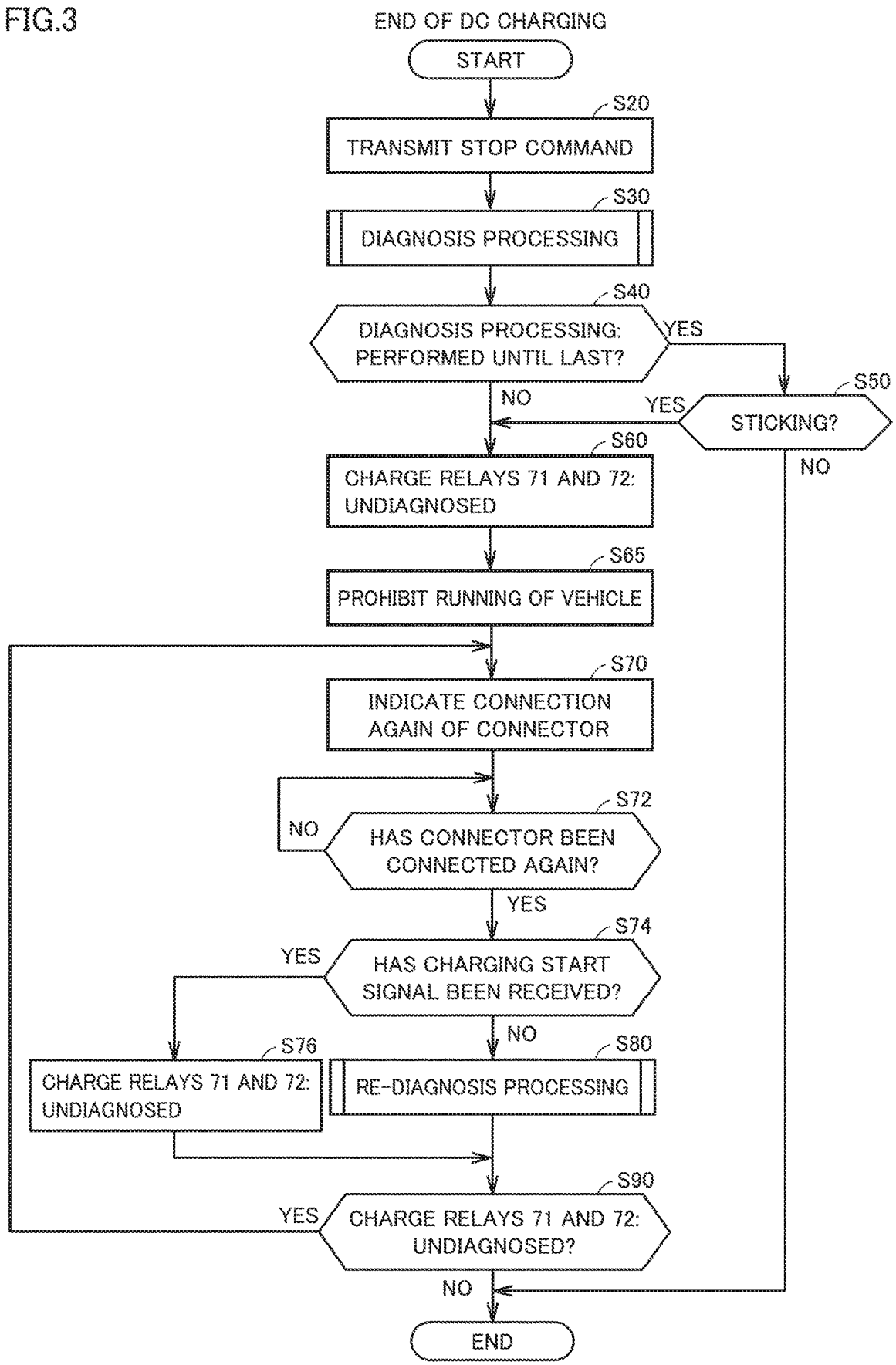
FIG. 3 is a flowchart (No. 1) showing a procedure in processing performed by the ECU of the vehicle when a condition for end of DC charging is satisfied.

FIG. 3 is a flowchart showing a procedure in processing performed by ECU 100 of vehicle 1 when a condition for end of DC charging is satisfied. Though an example in which each step in the flowcharts shown in FIG. 3 and FIGS. 4 to 7 which will be described later is performed by software processing by ECU 100 is described, the step may be performed partially or entirely by hardware (electrical circuits) fabricated in ECU 100.

Referring to FIG. 3, when a condition for end of DC charging is satisfied, ECU 100 transmits a stop command requesting DC power feed facility 200 to stop output of electric power through communication apparatus 110 (S20). DC power feed facility 200 that has received the stop command from vehicle 1 stops supply of electric power in accordance with the stop command.

Then, ECU 100 performs diagnosis processing (S30). The diagnosis processing according to the present embodiment specifically includes both-element diagnosis processing and one-element diagnosis processing. Both-element diagnosis processing refers to processing for diagnosing whether or not both of charge relays 71 and 72 have stuck. One-element diagnosis processing refers to processing for diagnosing whether or not each of charge relays 71 and 72 has stuck. Diagnosis processing will be described in detail with reference to FIGS. 4, 5, and 6.

Figure 4:
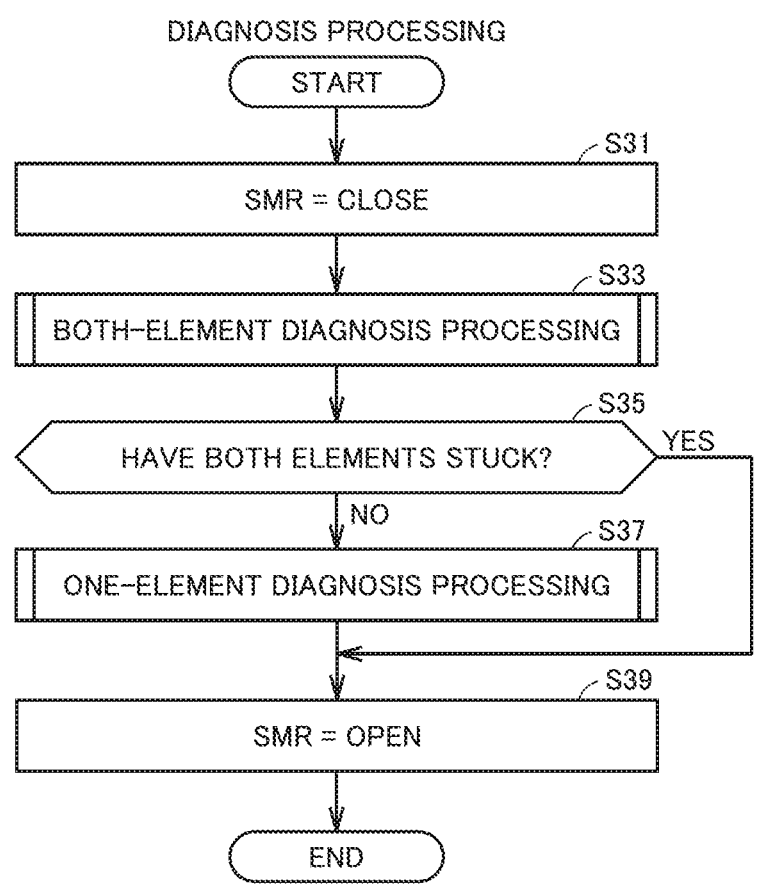
FIG. 4 is a flowchart showing a procedure in diagnosis processing according to the embodiment.
Figure 5:
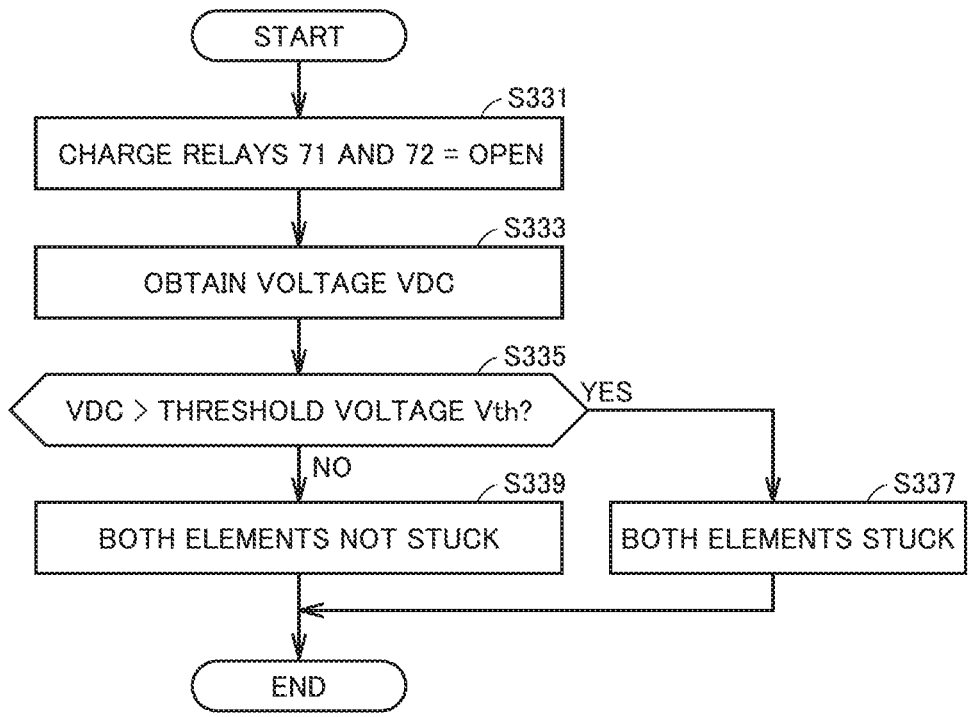
FIG. 5 is a flowchart showing a procedure in both-element diagnosis processing included in diagnosis processing according to the embodiment.
Figure 6:
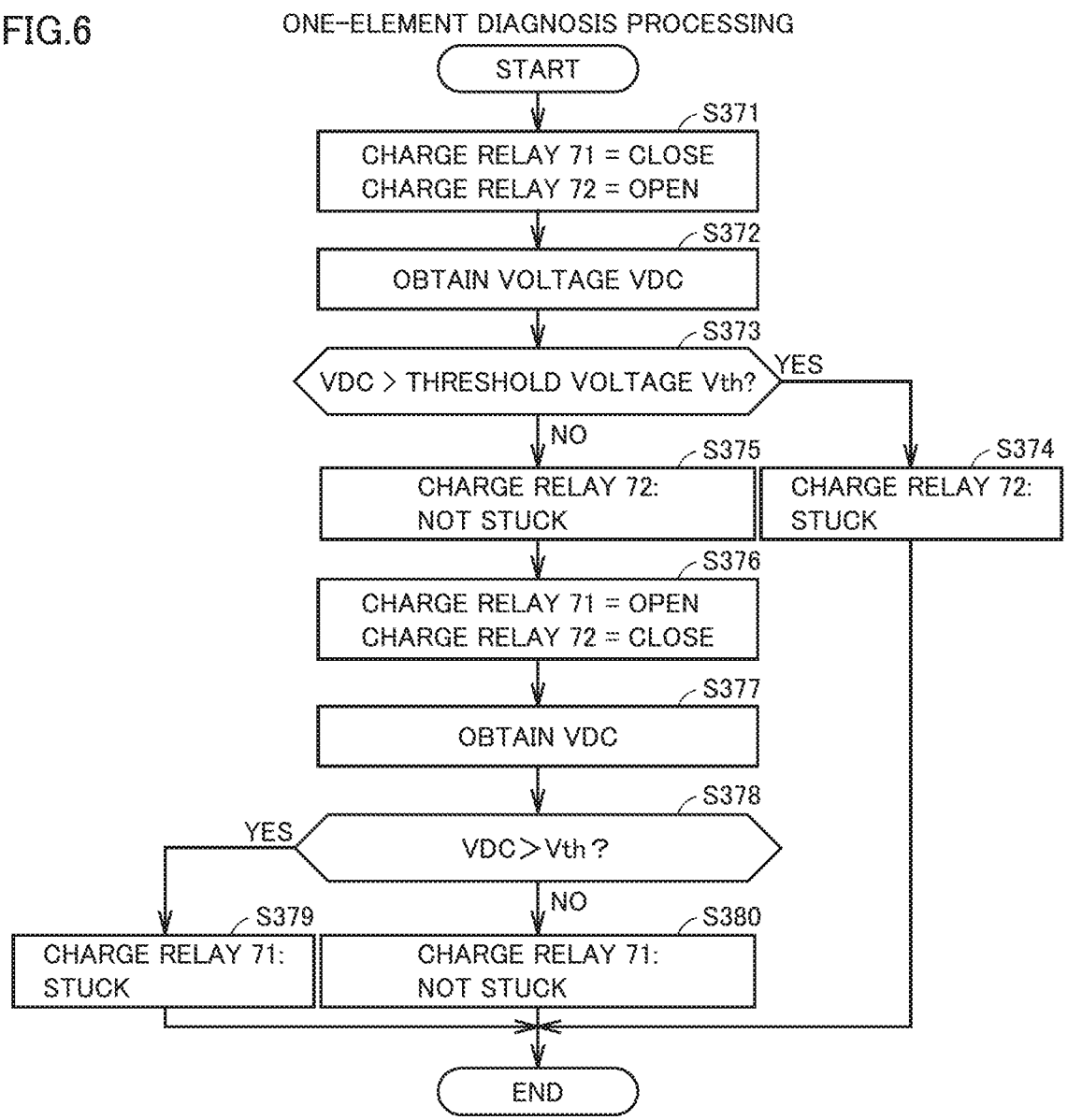
FIG. 6 is a flowchart showing a procedure in one-element diagnosis processing included in the diagnosis processing according to the embodiment.

FIG. 4 is a flowchart showing a procedure in diagnosis processing according to the present embodiment. FIG. 5 is a flowchart showing a procedure in both-element diagnosis processing included in the diagnosis processing according to the present embodiment. FIG. 6 is a flowchart showing a procedure in one-element diagnosis processing included in the diagnosis processing according to the present embodiment.

Referring to FIG. 4, as diagnosis processing is started, ECU 100 outputs a command to close SMRs 21 and 22 to close SMRs 21 and 22 (S31). When SMRs 21 and 22 are closed after end of DC charging, the closed state should only be maintained.

Then, ECU 100 performs both-element diagnosis processing (S33). Referring to FIG. 5, in both-element diagnosis processing, ECU 100 outputs a command to open both of charge relays 71 and 72 (S331).

Then, ECU 100 obtains voltage VDC detected by voltage sensor 80 (S333) and compares voltage VDC with a threshold voltage Vth (S335). Threshold voltage Vth is a threshold value for determining whether or not a voltage of power storage 10 is being applied to charge port 90 through SMRs 21 and 22, charge relays 71 and 72, and power lines CPL and CNL in diagnosis processing. Threshold voltage Vth is set, for example, to a value lower than a voltage at a lower limit SOC of power storage 10.

When voltage VDC is higher than threshold voltage Vth in S335, that is, when voltage sensor 80 detects a voltage of power storage 10 in spite of output of an open command to charge relays 71 and 72, it can be concluded that both of charge relays 71 and 72 have stuck in the closed state. Therefore, when voltage VDC is higher than threshold voltage Vth in S335 (YES in S335), ECU 100 determines that both of charge relays 71 and 72 have stuck in the closed state (both elements stuck) (S337). In this case, ECU 100 sets, for example, a flag indicating that both elements have stuck.

When voltage VDC is equal to or lower than threshold voltage Vth in S335 (NO in S335), ECU 100 determines that both of charge relays 71 and 72 have not stuck in the closed state (both elements not stuck), that is, at least one of charge relays 71 and 72 is open in accordance with the open command (S339). In this case, ECU 100 sets, for example, a flag indicating that both elements have not stuck.

When ECU 100 determines that both of the elements have stuck or have not stuck in S337 or S339, it quits both-element diagnosis processing.

Referring again to FIG. 4, when both of charge relays 71 and 72 are determined as having stuck in the closed state in both-element diagnosis processing, that is, the flag indicating that both elements have stuck is set (YES in S35), ECU 100 outputs a command to open SMRs 21 and 22 to open SMRs 21 and 22 (S39) and quits diagnosis processing.

When ECU 100 determines that both of charge relays 71 and 72 have not stuck in the closed state in both-element diagnosis processing, that is, the flag indicating that both elements have not stuck is set (NO in S35), it performs one-element diagnosis processing and diagnoses whether or not each of charge relays 71 and 72 has stuck (S37).

Referring to FIG. 6, in one-element diagnosis processing, ECU 100 initially diagnoses whether or not charge relay 72 has stuck. Specifically, ECU 100 outputs a command to close charge relay 71 and to open charge relay 72 (S371).

ECU 100 obtains voltage VDC detected by voltage sensor 80 (S372) and compares voltage VDC with threshold voltage Vth (S373). When charge relay 72 is open in accordance with the open command, it is expected that voltage VDC detected by voltage sensor 80 is equal to or lower than threshold voltage Vth in S373. When charge relay 72 has stuck in the closed state, both of charge relays 71 and 72 are closed and hence a voltage of power storage 10 is applied to charge port 90. Therefore, it is expected that voltage VDC detected by voltage sensor 80 is higher than threshold voltage Vth.

When voltage VDC is higher than threshold voltage Vth (YES in S373), ECU 100 determines that charge relay 72 has stuck in the closed state (S374). Since both of charge relays 71 and 72 have not been determined as having stuck in the closed state in both-element diagnosis processing in this case, it can be concluded that charge relay 71 is normally operating. Therefore, ECU 100 quits one-element diagnosis processing without diagnosing whether or not charge relay 71 has stuck. In S374, for example, ECU 100 sets a flag indicating sticking for charge relay 72.

When voltage VDC is equal to or lower than threshold voltage Vth (NO in S373), ECU 100 determines that charge relay 72 has not stuck in the closed state (S375). Then, ECU 100 determines whether or not charge relay 71 has stuck.

ECU 100 outputs a command to open charge relay 71 and to close charge relay 72 (S376).

Then, ECU 100 obtains voltage VDC detected by voltage sensor 80 (S377) and compares voltage VDC with threshold voltage Vth (S378). When charge relay 71 is open in accordance with the open command in this case, it is expected that voltage VDC detected by voltage sensor 80 is equal to or lower than threshold voltage Vth. When charge relay 71 has stuck in the closed state, both of charge relays 71 and 72 are closed and hence a voltage of power storage 10 is applied to charge port 90. Therefore, it is expected that voltage VDC detected by voltage sensor 80 is higher than threshold voltage Vth.

When voltage VDC is higher than threshold voltage Vth (YES in S378), ECU 100 determines that charge relay 71 has stuck in the closed state (S379). In this case, ECU 100 sets, for example, a flag indicating sticking for charge relay 71.

When voltage VDC is equal to or lower than threshold voltage Vth (NO in S378), ECU 100 determines that charge relay 71 has not stuck in the closed state (S380). In this case, neither of charge relays 71 and 72 have stuck and charge relays 71 and 72 are determined as being normal. In this case, ECU 100 sets, for example, a flag indicating absence of sticking.

When ECU 100 determines whether or not charge relay 71 has stuck in S379 or S380, it quits one-element diagnosis processing.

The order of diagnosing charge relays 71 and 72 in one-element diagnosis processing is not particularly limited. Though an example in which whether or not charge relay 72 has stuck is initially diagnosed and thereafter whether or not charge relay 71 has stuck is diagnosed is described above, whether or not charge relay 71 has stuck may be diagnosed and thereafter whether or not charge relay 72 has stuck may be diagnosed.

Referring again to FIG. 4, when one-element diagnosis processing ends, ECU 100 outputs a command to open SMRs 21 and 22 to open SMRs 21 and 22 (S39) and quits diagnosis processing.

Referring again to FIG. 3, as diagnosis processing ends, ECU 100 determines whether or not the diagnosis processing normally ended in S40 and S50 (S40 and S50).

Specifically, initially, ECU 100 determines whether or not diagnosis processing was performed until the last (whether or not diagnosis processing was completed) (S40). Assumed examples of diagnosis processing not performed until the last include a case that the processing was not started for some factor or the processing was not performed until the last due to forced termination in the middle of the processing even though the processing had been started. Specific examples include a case that diagnosis processing was not started because DC power feed facility 200 did not stop supply of electric power due to an abnormal condition thereof or communication abnormality caused by noise in spite of transmission of a stop command from vehicle 1 to DC power feed facility 200 in S20 and a case that processing was forcibly terminated in the middle of diagnosis processing due to occurrence of an abnormal condition in vehicle 1 and/or DC power feed facility 200 in the middle of the diagnosis processing.

When diagnosis processing was not performed until the last (NO in S40), ECU 100 sets a flag indicating that charge relays 71, 72 have been undiagnosed (S60). Diagnosis processing not performed until the last means that diagnosis processing did not normally end.

When diagnosis processing was performed until the last (YES in S40), ECU 100 determines whether or not at least any one of charge relays 71 and 72 has been determined as stuck in diagnosis processing (S50). Specifically, ECU 100 determines in S50 which of a flag indicating sticking of both elements, a flag indicating sticking of charge relay 71, and a flag indicating sticking of charge relay 72 has been set.

When neither of charge relays 71 and 72 are determined as having stuck in diagnosis processing, that is, when the flag indicating absence of sticking has been set (NO in S50), ECU 100 quits the process.

When it is determined in diagnosis processing that at least any one of charge relays 71 and 72 has stuck (YES in S50), ECU 100 sets a flag indicating that charge relays 71, 72 have been undiagnosed (S60). In the present embodiment, diagnosis as sticking of charge relay 71 and/or charge relay 72 is not finalized by a result of diagnosis processing performed once, but when it is determined in first diagnosis processing that at least any one of charge relays 71 and 72 has stuck, re-diagnosis processing which will be described later is performed and occurrence of sticking is finalized in accordance with a result of the re-diagnosis processing. Diagnosis as sticking of charge relay 71 and/or charge relay 72 may be finalized by a result of diagnosis processing performed once. In this case, when at least any one of charge relays 71 and 72 is determined as having stuck in diagnosis processing (YES in S50), for example, control for prohibiting running of vehicle 1 is carried out, a warning indicating occurrence of sticking in a charge relay is shown on display 60, and the process ends. Determination as occurrence of sticking in at least any one of charge relays 71 and 72 in diagnosis processing means that diagnosis processing did not normally end.

As the flag indicating that charge relays 71, 72 have been undiagnosed is set, for example, ECU 100 carries out control for prohibiting running of vehicle 1 (S65). In this case, desirably, re-diagnosis processing is performed and whether or not charge relay 71 and/or charge relay 72 have/has stuck is appropriately diagnosed. Then, notification for inviting a user to perform re-diagnosis processing is desirably given. The re-diagnosis processing refers to processing for performing again the diagnosis processing (S30) described with reference to FIG. 4 and performing processing for monitoring for reception of a charging start signal which will be described later.

A user who finished DC charging and diagnosis processing is expected to remove connector 310 from charge port 90 (disconnect the connector from the charge port) and get into vehicle 1. Then, ECU 100 has display 60 of vehicle 1 show information inviting the user to perform re-diagnosis processing and information inviting the user to connect again connector 310 to charge port 90. ECU 100 requests a user who got into vehicle 1 to connect again connector 310 to charge port 90 (S70). For example, the user who finished DC charging and got into vehicle 1 can recognize the necessity to perform re-diagnosis processing for charge relays 71, 72 and recognize the necessity of connection again of connector 310 to charge port 90 as an operation for performing re-diagnosis processing.

Request for connection of connector 310 to charge port 90 for performing re-diagnosis processing is issued for preventing exposure of charge port 90 during re-diagnosis processing. For example, when both of charge relays have stuck in the closed state or when one charge relay has stuck in the closed state, a voltage of power storage 10 may be applied to charge port 90 in diagnosis processing. By performing re-diagnosis processing with connector 310 being connected to charge port 90, charge port 90 is prevented from being exposed during re-diagnosis processing.

When connector 310 is connected again to charge port 90, re-diagnosis processing may be performed to diagnose whether or not charge relay 71 and/or charge relay 72 have/has stuck. For example, however, after the user connects connector 310 to charge port 90 again, the user may inadvertently operate charging start switch 240 provided in DC power feed facility 200. As charging start switch 240 is operated, DC power feed facility 200 starts the charge sequence and for example, may apply a voltage for insulation diagnosis to charge port 90. Among current DC power feed facilities 200, there is a DC power feed facility of such specifications that it starts the charge sequence as connector 310 is connected to charge port 90. When DC power feed facility 200 of such specifications is employed as well, as connector 310 is connected to charge port 90 for re-diagnosis processing, DC power feed facility 200 may start the charge sequence and for example, apply a voltage for insulation diagnosis to charge port 90.

When re-diagnosis processing is performed while a voltage is being applied by DC power feed facility 200 to charge port 90, voltage sensor 80 may detect the voltage in spite of charge relay 71 and/or charge relay 72 being normally open in accordance with the open command. Consequently, in spite of charge relay 71 and/or charge relay 72 not having stuck, erroneous diagnosis that charge relay 71 and/or charge relay 72 have/has stuck may be made.

Vehicle 1 according to the present embodiment does not perform re-diagnosis processing under such a condition that a voltage may unintentionally be applied by DC power feed facility 200 to charge port 90 as described above. For determination as to whether or not a condition is such that a voltage may unintentionally be applied by DC power feed facility 200 to charge port 90, a charging start signal transmitted at the time of start of the charge sequence from DC power feed facility 200 is used. Specifically, as connector 310 is connected again to charge port 90, vehicle 1 according to the present embodiment determines whether or not it has received the charging start signal from DC power feed facility 200. As described above, DC power feed facility 200 initially transmits the charging start signal to the vehicle when it starts the charge sequence. When the charging start signal is received from DC power feed facility 200, DC power feed facility 200 may apply a voltage to charge port 90. Therefore, when the charging start signal is received at the time of connection again of connector 310 to charge port 90, re-diagnosis processing is not performed. Erroneous diagnosis in re-diagnosis processing that charge relay 71 and/or charge relay 72 have/has stuck can thus be suppressed.

When the charging start signal has not been received from DC power feed facility 200, it can be estimated that DC power feed facility 200 will not start the charge sequence. It can be estimated that the condition is not such that a voltage may unintentionally be applied by DC power feed facility 200 to charge port 90 and a voltage will not be applied by DC power feed facility 200 to charge port 90. In this case, whether or not charge relay 71 and/or charge relay 72 have/has stuck can appropriately be diagnosed by performing re-diagnosis processing. The charging start signal according to the present embodiment corresponds to one example of the "start signal" according to the present disclosure.

The user may inadvertently operate charging start switch 240 of DC power feed facility 200 also during re-diagnosis processing. When charging start switch 240 is operated while re-diagnosis processing is being performed as well, DC power feed facility 200 starts the charge sequence and DC power feed facility 200 transmits the start signal to vehicle 1. When re-diagnosis processing is continued in this case, a voltage is applied by DC power feed facility 200 to charge port 90, which may result in erroneous diagnosis that charge relay 71 and/or charge relay 72 have/has stuck in spite of charge relay 71 and/or charge relay 72 not having stuck.

Vehicle 1 according to the present embodiment monitors for reception of the charging start signal also while re-diagnosis processing is being performed. When the vehicle receives the charging start signal while it is performing re-diagnosis processing, it aborts the re-diagnosis processing. Erroneous diagnosis in re-diagnosis processing that charge relay 71 and/or charge relay 72 have/has stuck can thus be suppressed.

In S72 in FIG. 3, ECU 100 waits for connection of connector 310 to charge port 90 (NO in S72). When connector 310 is connected to charge port 90 (YES in S72), ECU 100 recognizes re-connection and determines whether or not it has received the charging start signal from DC power feed facility 200 (S74).

When ECU 100 receives the charging start signal from DC power feed facility 200 (YES in S74), it sets the flag indicating that charge relays 71, 72 have been undiagnosed (S76).

When ECU 100 has not received the charging start signal from DC power feed facility 200 (NO in S74), it performs re-diagnosis processing (S80). In re-diagnosis processing, processing similar to diagnosis processing in S30 and processing for monitoring for reception of the charging start signal are performed in parallel. Since the diagnosis processing is the same as in S30, description thereof will not be repeated.

Figure 7:
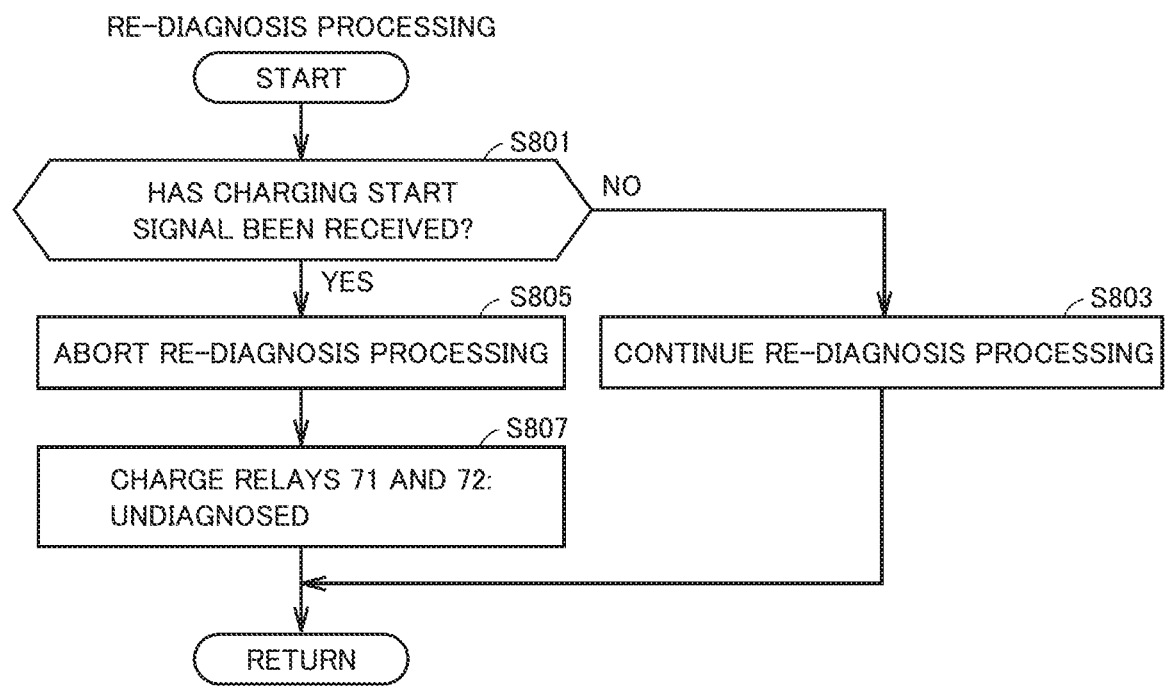
FIG. 7 is a flowchart for illustrating a procedure in processing for monitoring for reception of a charging start signal.

FIG. 7 is a flowchart for illustrating a procedure in processing for monitoring for reception of a charging start signal. This flowchart is started with execution of re-diagnosis processing and repeatedly performed every prescribed control period.

ECU 100 determines whether or not it has received the charging start signal from DC power feed facility 200 (S801). When the ECU has not received the charging start signal from DC power feed facility 200 (NO in S801), it continues re-diagnosis processing (S803).

When the ECU has received the charging start signal from DC power feed facility 200 (YES in S801), the ECU aborts the re-diagnosis processing (S805). Namely, the ECU aborts diagnosis processing that has been performed in parallel. ECU 100 then sets the flag indicating that charge relays 71, 72 have been undiagnosed (S807).

Referring again to FIG. 3, ECU 100 determines whether or not the flag indicating that charge relays 71, 72 had been undiagnosed has been set (S90).

When a flag other than the flag indicating that charge relays 71, 72 have been undiagnosed, that is, the flag indicating sticking of both elements, the flag indicating sticking of charge relay 71, the flag indicating sticking of charge relay 72, and the flag indicating absence of sticking, has been set in re-diagnosis processing (NO in S90), ECU 100 finalizes a result of determination indicated by the set flag. Specifically, when the flag indicating absence of sticking has been set, ECU 100 permits running of vehicle 1 and quits the process. When the flag indicating sticking of both elements, the flag indicating sticking of charge relay 71, or the flag indicating sticking of charge relay 72 has been set, ECU 100 quits the process with control for prohibiting running of vehicle 1 being continued. In this case, a warning to the effect that charge relay 71 and/or charge relay 72 have/has stuck may be shown on display 60.

When the flag indicating that charge relays 71, 72 have been undiagnosed has been set (YES in S90), the process returns to S70. Namely, re-diagnosis processing is performed again. The flag indicating that charge relays 71, 72 have been undiagnosed is set when re-diagnosis processing was not performed or re-diagnosis processing was not performed under an appropriate environment. In such a case, by repeatedly performing re-diagnosis processing, re-diagnosis processing can be performed at timing when an appropriate environment is created. By performing re-diagnosis processing under the appropriate environment, whether or not charge relay 71 and/or charge relay 72 have/has stuck can appropriately be diagnosed.

As set forth above, vehicle 1 according to the present embodiment determines whether or not a charging start signal has been received from DC power feed facility 200 in starting re-diagnosis processing. When the charging start signal has been received, that is, when a condition is such that a voltage may unintentionally be applied by DC power feed facility 200 to charge port 90, re-diagnosis processing is not performed. Erroneous diagnosis in re-diagnosis processing that charge relay 71 and/or charge relay 72 have/has stuck can thus be suppressed.

When a charging start signal has not been received in starting re-diagnosis processing, that is, when it is estimated that a voltage will not unintentionally be applied by DC power feed facility 200 to charge port 90, re-diagnosis processing is performed. In this case, whether or not charge relay 71 and/or charge relay 72 have/has stuck can appropriately be diagnosed by performing re-diagnosis processing.

Reception of a charging start signal is monitored for also during re-diagnosis processing. When the charging start signal is received during re-diagnosis processing, erroneous diagnosis in re-diagnosis processing that charge relay 71 and/or charge relay 72 have/has stuck can be suppressed by aborting re-diagnosis processing.

(Modification)

In the embodiment, an example in which a CAN signal is transmitted from vehicle 1 to DC power feed facility 200 for starting CAN communication between DC power feed facility 200 and vehicle 1 after transmission of the charging start signal from DC power feed facility 200 to vehicle 1 has been described. Depending on a standard with which a DC power feed facility is in conformity, however, there is a DC power feed facility that transmits a CAN signal to vehicle 1 for starting CAN communication with vehicle 1 after transmission of the charging start signal therefrom to vehicle 1. Such a DC power feed facility is denoted as a "DC power feed facility 200A" below and distinguished from DC power feed facility 200 in the embodiment. In employing DC power feed facility 200A, whether or not DC power feed facility 200A starts a charge sequence can be determined based on a CAN signal.

Figure 8:
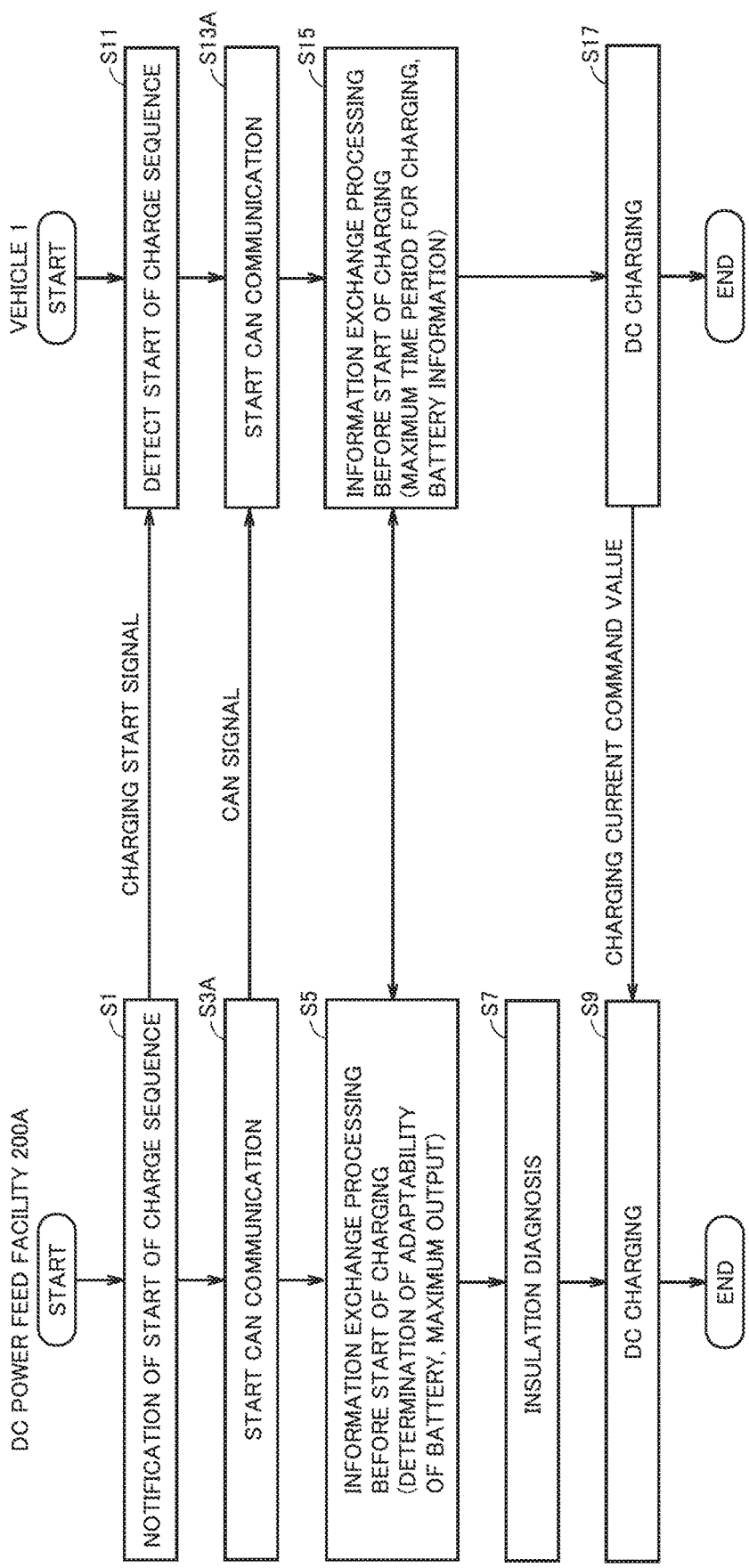
FIG. 8 is a flowchart showing a procedure in processing for starting DC charging performed by a controller of a DC power feed facility and the ECU of the vehicle according to a modification.

FIG. 8 is a flowchart showing a procedure in processing for starting DC charging performed by a controller 230A of DC power feed facility 200A and ECU 100 of vehicle 1 according to a modification. The flowchart shown in FIG. 8 is a modification to the flowchart in FIG. 2 where S3 and S13 are modified to S3A and S13A, respectively. Since other steps are the same as in FIG. 2, description will not be repeated.

As the charge sequence is started, controller 230A of DC power feed facility 200A transmits a charging start signal to vehicle 1 (S1).

Then, controller 230A of DC power feed facility 200A transmits a CAN signal from DC power feed facility 200A to vehicle 1 for starting CAN communication between DC power feed facility 200A and vehicle 1 (S3A). CAN communication between DC power feed facility 200A and vehicle 1 is thus started (S3A and S13A).

As set forth above, when DC power feed facility 200A starts the charge sequence, it transmits a charging start signal to vehicle 1 and thereafter transmits a CAN signal to vehicle 1. Therefore, start of the charge sequence by DC power feed facility 200A can be detected based on a "CAN signal" transmitted from DC power feed facility 200A to vehicle 1 in S3A.

Figure 9:
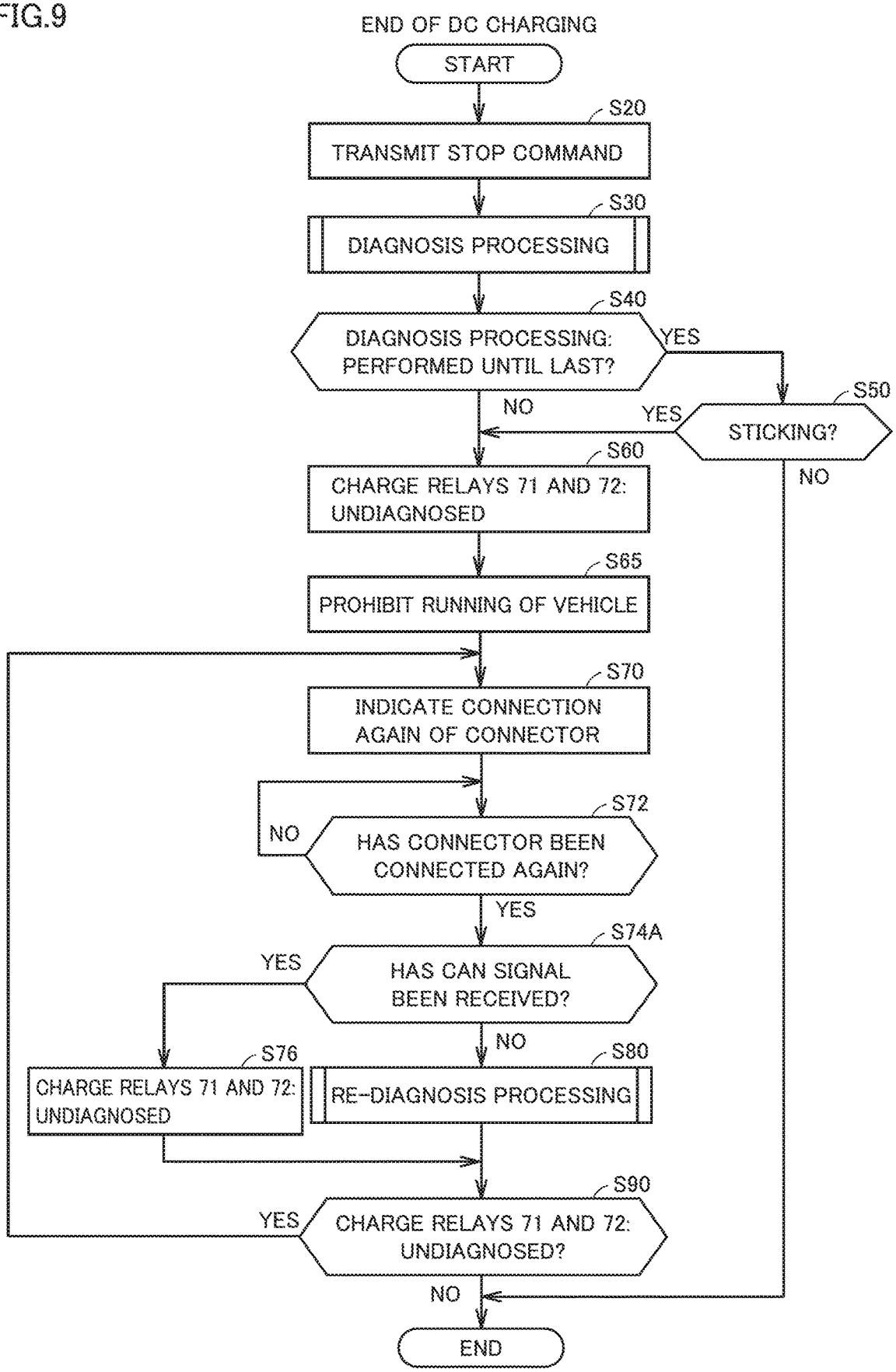
FIG. 9 is a flowchart (No. 2) showing a procedure in processing performed by the ECU of the vehicle when a condition for end of DC charging is satisfied.

FIG. 9 is a flowchart showing a procedure in processing performed by ECU 100 of vehicle 1 when a condition for end of DC charging is satisfied. The flowchart shown in FIG. 9 is a modification to the flowchart in FIG. 3 where S74 is modified to S74A. Since other steps are the same as in FIG. 3, description will not be repeated.

FIG. 10 is a flowchart for illustrating a procedure in processing for monitoring for reception of a CAN signal. The flowchart shown in FIG. 10 is a modification to the flowchart in FIG. 7 where S801 is modified to S801A. Since other steps are the same as in FIG. 7, description will not be repeated.

Referring initially to FIG. 9, when connector 310 is connected to charge port 90 (YES in S72), ECU 100 recognizes re-connection and determines whether or not it has received a CAN signal from DC power feed facility 200A (S74A).

When ECU 100 has received the CAN signal from DC power feed facility 200A (YES in S74A), it sets the flag indicating that charge relays 71, 72 have been undiagnosed (S76).

When ECU 100 has not received the CAN signal from DC power feed facility 200A (NO in S74A), it performs re-diagnosis processing (S80).

Referring then to FIG. 10, when re-diagnosis processing is started, ECU 100 determines whether or not it has received the CAN signal from DC power feed facility 200A (S801A). When the ECU has not received the CAN signal from DC power feed facility 200A (NO in S801A), it continues re-diagnosis processing (S803). When the ECU has received the CAN signal from DC power feed facility 200A (YES in S801A), it aborts re-diagnosis processing (S805).

An effect the same as in the embodiment can be achieved also by determining whether or not DC power feed facility 200A starts the charge sequence based on a CAN signal instead of a charging start signal.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A vehicle comprising:
   a power storage chargeable by receiving electric power supplied through a charge cable from a power feed facility outside the vehicle;
   a charge port to which a connector provided in the charge cable can be connected;
   a first charge relay electrically connected between a positive electrode of the power storage and the charge port;
   a second charge relay electrically connected between a negative electrode of the power storage and the charge port; and
   a controller that performs diagnosis processing for diagnosing whether the first charge relay and/or the second charge relay have/has stuck with the connector and the charge port being connected to each other, wherein
   the controller
   performs the diagnosis processing after end of charging of the power storage,
   requests, when the diagnosis processing has not normally ended, connection again of the connector to the charge port for performing re-diagnosis processing for diagnosing again whether the first charge relay and/or the second charge relay have/has stuck, and
   does not perform the re-diagnosis processing when the connector and the charge port are connected to each other again and when the controller receives a start signal indicating start of charging from the power feed facility.

2. The vehicle according to claim 1, wherein
the diagnosis processing not having normally ended includes determination as the first charge relay and/or the second charge relay having stuck in the diagnosis processing and the diagnosis processing not having been completed.

3. The vehicle according to claim 1, wherein
the controller performs the re-diagnosis processing when the connector and the charge port are connected again to each other and when the controller has not received the start signal from the power feed facility.

4. The vehicle according to claim 3, wherein
the controller aborts the re-diagnosis processing when the controller receives the start signal from the power feed facility while the controller is performing the re-diagnosis processing.

* * * * *